United States Patent [19]

Eitan

[11] Patent Number: 5,862,076
[45] Date of Patent: *Jan. 19, 1999

[54] FAST EPROM ARRAY

[75] Inventor: Boaz Eitan, Sunnyvale, Calif.

[73] Assignee: WaferScale Integration, Inc., Fremont, Calif.

[*] Notice: The term of this patent shall not extend beyond the expiration date of Pat. No. 5,204,835.

[21] Appl. No.: 908,595

[22] Filed: Jun. 30, 1992

Related U.S. Application Data

[63] Continuation of Ser. No. 612,346, Nov. 13, 1990, abandoned.

[51] Int. Cl.[6] .................................................. G11C 16/06
[52] U.S. Cl. ...................... 365/185.16; 365/51; 365/52; 365/63; 365/185.05; 365/230.04; 257/316
[58] Field of Search ............................... 365/185, 230.03, 365/52, 63, 51, 218, 230.04, 185.16, 185.05; 357/23.5; 257/316

[56] References Cited

U.S. PATENT DOCUMENTS

| | | |
|---|---|---|
| 4,258,466 | 3/1981 | Kuo et al. ........................... 365/185.13 |
| 4,267,632 | 5/1981 | Shappir . |
| 4,281,387 | 7/1981 | Neal et al. ............................... 365/189 |
| 4,281,397 | 7/1981 | Neal et al. ............................... 365/189 |
| 4,377,818 | 3/1983 | Kuo et al. ........................... 365/185.13 |
| 4,635,347 | 1/1987 | Lien et al. . |
| 4,698,900 | 10/1987 | Esquivel . |
| 4,720,323 | 1/1988 | Sato . |
| 4,727,515 | 2/1988 | Hsu . |
| 4,749,443 | 6/1988 | Mitchell et al. . |
| 4,792,925 | 12/1988 | Corda et al. ........................ 365/185.16 |
| 4,795,719 | 1/1989 | Eitan . |
| 4,806,201 | 2/1989 | Mitchell et al. . |
| 4,833,514 | 5/1989 | Esquivel et al. . |
| 4,912,676 | 3/1990 | Paterson . |
| 4,930,105 | 5/1990 | Matsumoto et al. ..................... 365/185 |
| 4,935,791 | 6/1990 | Namaki et al. ......................... 357/23.5 |
| 4,972,378 | 11/1990 | Kitagawa et al. ....................... 365/185 |
| 4,992,980 | 2/1991 | Park et al. .............................. 365/185 |
| 5,008,856 | 4/1991 | Iwahashi . |
| 5,023,681 | 6/1991 | Ha ..................................... 365/230.03 |
| 5,197,029 | 3/1993 | Schreck et al. ......................... 365/185 |
| 5,204,835 | 4/1993 | Eitan ................................. 365/185.13 |
| 5,245,570 | 9/1993 | Fazio et al. ......................... 365/185.13 |

FOREIGN PATENT DOCUMENTS

| | | |
|---|---|---|
| 0 326 465 A1 | 1/1989 | European Pat. Off. . |
| A 0 326 465 | 8/1989 | European Pat. Off. ................... 27/10 |
| 40 07 356 A1 | 9/1990 | Germany . |
| 59-103352 | 6/1984 | Japan . |
| 63-186477 | 8/1988 | Japan . |
| A-2 144 006 | 2/1985 | United Kingdom . |

OTHER PUBLICATIONS

M. Okada et al., "16 Mb ROM Design Using Bank Arch.," Symp. on VLSI CKTS.,Tokyo, Japan, Aug.22–24, 1988, pp. 85–86.

Symposium on ULSI Circuits, Tokio, Saparl, pp. 85–86, Digest of Technical Papers.

Gaffney et al., *"Dense Hot Electron Programmable Memory,"* IBM Technical Disclosure Bulletin, vol. 23, No. 10, Mar. 1981, pp. 4458–4460.

*Primary Examiner*—Joseph E. Clawson, Jr.
*Attorney, Agent, or Firm*—Skjerven, Morrill, MacPherson, Franklin and Friel, LLP; David T. Millers

[57] ABSTRACT

Each read line in a memory array containing a plurality of alternating bit lines and read lines with columns of memory cells therebetween, is broken into a plurality of electrically isolatable segments. As a result, the capacitance associated with each read line is significantly reduced and the speed of reading information from or writing information into a memory cell is significantly increased while at the same time not decreasing the density of the array.

33 Claims, 11 Drawing Sheets

FAST EPROM ARRAY

This application is a continuation of application Ser. No. 07/612,346, filed Nov. 13, 1990 now abandoned.

FIELD OF THE INVENTION

This invention relates to an EPROM array and in particular to a high density, high speed EPROM array utilizing a virtual ground with a segmented, dedicated read line.

BACKGROUND OF THE INVENTION

Extensive efforts have been made to shrink the cell size in electrically programmable read only memories, called "EPROMs". In general, the smaller the cell size the smaller the integrated circuit die or chip containing a given number of EPROM cells and therefore the higher the yield of useful semiconductor dice in the manufacturing process. Examples of these efforts include the EPROM arrays shown in U.S. Pat. Nos. 4,267,632 and 4,639,893.

An asymmetric memory transistor which eliminates problems of read disturb and drain turn-on is disclosed in an article entitled "A 50-ns 256K CMOS Split-Gate EPROM" by Sahid B. Ali et al., published in the IEEE Journal of Solid State Circuits, Vol. 23, No. 1, February 1988, pp. 79–85. The memory cell disclosed in this article also insures uniform characteristics of each memory transistor across the memory array despite manufacturing tolerances and variations in mask placement. The high read current capable of being used in the cell disclosed in the Ali article gives a speed advantage to the memory array. Another example of an EPROM structure which results in reduced cell size is disclosed in patent application Ser. No. 07/539,657 filed Jun. 13, 1990 on an invention of Boaz Eitan entitled "EPROM Virtual Ground Array" and assigned to WaferScale Integration, Incorporated, the assignee of this invention. Application Ser. No. 07/539,657 is hereby incorporated by reference in its entirety. In application Ser. No. 07/539,657, an electrically programmable read only memory contains alternating metal bit lines and diffused bit lines. Each diffused bit line is broken into a plurality of segments which each comprise a virtual source. A multiplicity of floating gate transistors are arranged in rows and columns. The floating gate transistors in each column are divided into M groups of P floating gate transistors each. The floating gate transistors in the $n^{th}$ and the $(n+1)^{th}$ columns, where $n^{th}$ is an odd integer given by $1 \leq n \leq N$ and N+1 is the maximum number of columns in the array, are connected to the segments of one diffused bit line placed between the $n^{th}$ and the $(n+1)^{th}$ columns. At least one first transfer transistor is arranged to connect one segment comprising a virtual source to a first metal bit line. The first metal bit line functions as the source for the N floating gate transistors in the $(n+1)^{th}$ column connected to said one segment. At least one second transfer transistor connects the same one segment comprising a virtual source to a second metal bit line. The second metal bit line functions as a source for the N floating gate transistors in the $n^{th}$ column connected to said one segment. The removal of each select transistor from the cell where it previously resided in series with its corresponding floating gate transistor, and the combining of a plurality of select transistors into one select transistor, substantially reduces the area taken by each memory cell in the array.

In the past, to achieve a high-density EPROM array, a virtual ground has been employed. The virtual ground eliminated the space previously taken in the prior art for an electrical contact to the drain region of each transistor in the array because the virtual ground requires only a few spaced electrical contacts. Unfortunately, the virtual ground results in a relatively low speed because of the high capacitance associated with each diffused bit line comprising the virtual ground.

To make a faster array, a different approach was employed wherein a pair of transistors shared a common ground and utilized separate drain diffusions. A plurality of drain diffusions were connected to a metal bit line through contacts as disclosed, for example in U.S. Pat. No. 4,868,629 issued Sep. 19, 1989, and assigned to WaferScale Integration, Inc., the assignee of this application. The resulting circuit was fast because of the use of separate drain diffusions for each of the transistors in the array, but the contacts to the drain diffusions from the overlying metal bit lines took up substantial space and thereby reduced substantially the density of the array. In addition, the diffusion source lines were contacted every eight or sixteen cells by an overlying metal source line. The contacts to the diffusion source lines, and the metal source lines both added substantial area to the array thereby further reducing the density of the array.

Furthermore, memory transistors require a high read current to be fast. To avoid a high read current and the corresponding problems associated therewith, two transistor or four transistor cells were used to generate a differential signal to represent the state of the memory. Unfortunately, two transistor or four transistor cells take substantially more area than a single transistor cell. See, for example, a paper by S. Pathak et al., entitled "A 25ns 16K CMOS PROM using a 420 transistor cell", ISSCC Dig. Tech. Papers, 1985, pp. 162–163.

SUMMARY OF THE INVENTION

In accordance with this invention a high density and high speed EPROM array is achieved by combining a virtual ground array with segmented, dedicated read lines. By segmenting the read lines, an effective low capacitance read line is achieved thereby increasing the read speed of each cell. By having a virtual ground array, the advantages of small cell size and a dense array are maintained.

In accordance with one embodiment of the invention, an EPROM array has bit lines (BL) and dedicated read lines (RL). The read lines are segmented into N bit sections, where N is a selected integer, for example 8, 16, 32, 64, or 128 although N does not necessarily have to be a multiple of 2. Each segmented section of the read line is connected to a corresponding metal read line through at least one select transistor. In a variation of this embodiment, each read line segment is connected to a corresponding metal read line through two such select transistors, one at each end of the read line segment.

Each metal read line is formed over but insulated from each of a plurality of read line segments arranged in a column. Each read line segment is, in one embodiment, connected to the overlying metal read line by means of two read line contacts formed through the insulation between the diffused read line and the metal read line, one at each end of the read line segment, and by two select transistors, one also at each end of the read line segment.

The diffused bit lines are also overlaid by and insulated from metal bit lines. To conserve silicon area, the bit line contacts between the diffused bit lines and the overlying metal bit lines are staggered relative to the read line contacts between the diffused read lines and the overlying metal bit lines.

As a result of the segmentation of each read line, the read line capacitance seen by the input and output circuitry is reduced by a factor given by the number of cells connected to one read line divided by the number of cells connected to each segment into which the read line is divided. Thus if 64 cells are connected to each segment of a read line and there are 1024 cells connected to the read line, the read line capacitance is reduced by 1024/64 or 16. Because the speed of accessing a cell and reading from the cell or writing into the cell is based upon the capacitance associated with the read line segment as well as the resistance associated with the cell, the choice of the number of cells connected to a line segment is based on the practical maximum resistance that a cell can have without slowing programming significantly. This is a matter of design choice.

One advantage of this invention is that the memory cell size is substantially reduced over the cell size employed for example in the fast array disclosed in U.S. Pat. No. 4,868,629 using a self-aligned split gate EPROM of the type disclosed in U.S. Pat. No. 4,639,893. The cell disclosed in the '629 patent has an area of about 22 square microns using 1.2 micron design rules. The cell constructed in accordance with this invention (whether asymmetric or symmetric) has an area of about 11.4 square microns using the same design rules. Accordingly, the structure of this invention improves the density of the array by a factor of two.

This invention will be better understood in conjunction with the following detailed description taken together with the following drawings.

DETAILED DESCRIPTION

The following description is of one embodiment of the invention and is merely illustrative of the principles of the invention. Other embodiments of the invention will be obvious to those skilled in the art in view of this description.

Figure 1A:
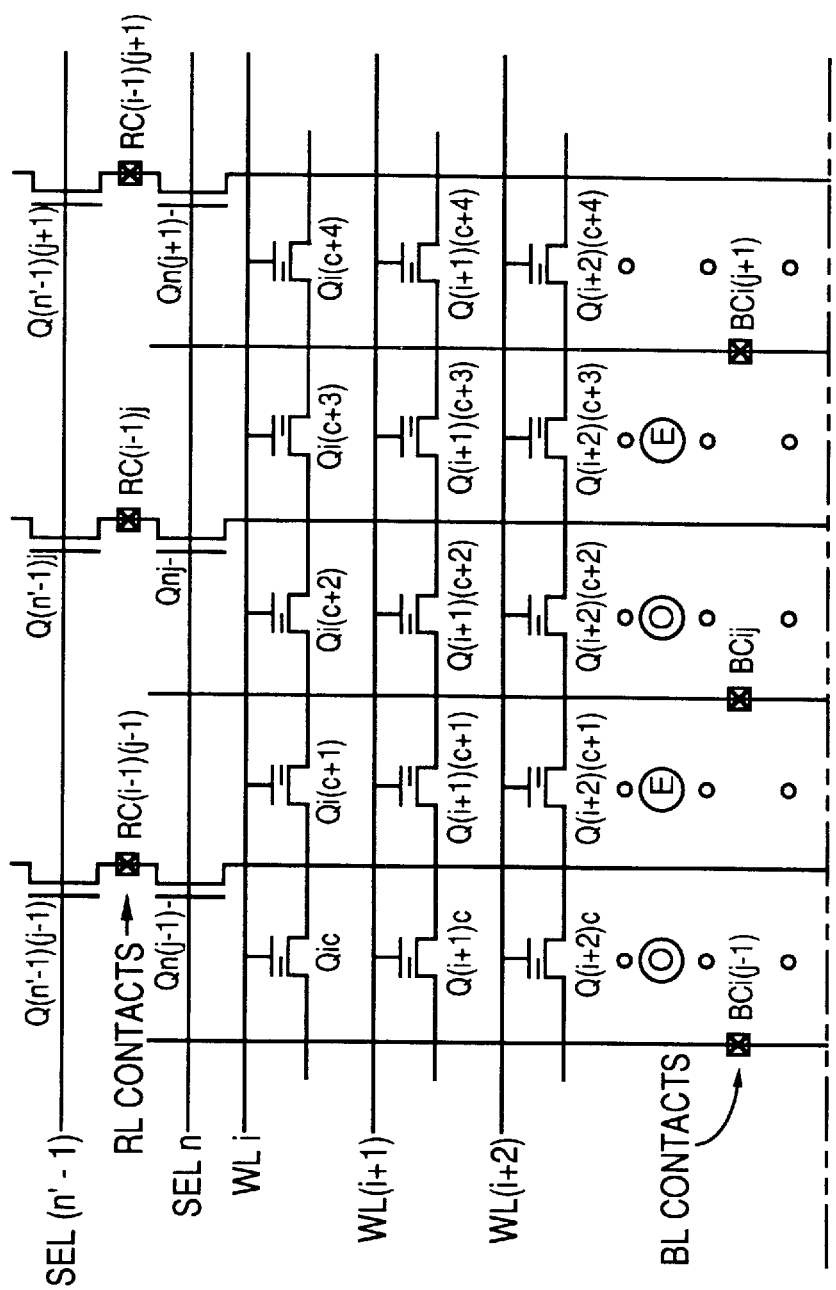
FIG. 1 shows the schematic equivalent circuit of the fast array in accordance with this invention.
Figure 1B:
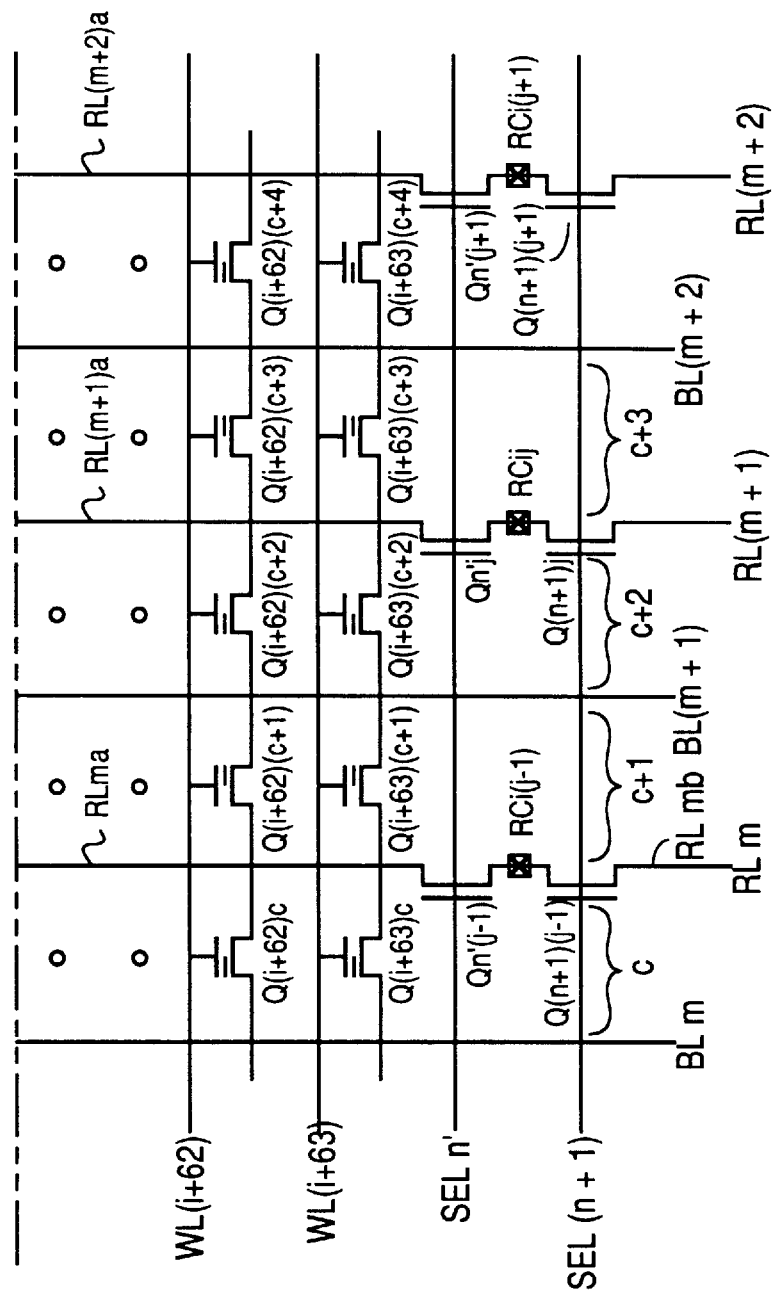

FIG. 1 illustrates a portion of an EPROM array formed as part of an integrated circuit in accordance with this invention. A portion of the integrated circuit EPROM array including memory transistors Qic through Q(i+63)(c+4) is illustrated in FIG. 1 together with certain select transistors such as select transistors Qn(j−1), Qnj, Qn(j+1), Qn'(j−1), Qn'j and Qn'(j+1). These select transistors are the transistors used in conjunction with memory cell transistors Qic through Q(i+63)(c+4). Other select transistors such as Q(n'−1)(j−1), Q(n'−1)j and Q(n'−1)(j+1) associated with the memory cell transistors (not shown) located in the region of the integrated circuit above that region containing memory cell transistors Qic through Q(i+63)(c+4) and select transistors Q(n+1)(j−1), Q(n+1)j and Q(n+1)(j+1) associated with the memory cell transistors in the section of the array just below the section of the array containing memory cell transistors Qic through Q(i+63)(c+4) are shown in FIG. 1.

In operation, to read a memory cell such as memory cell Qic, a voltage Vcc is applied to select lines SELn and SELn' thereby turning on each of the select transistors Qn(j−1), Qnj, Qn(j+1) connected to select line SELn and turning on each of the select transistors Qn'(j−1), Qn'j and Qn'(j+1) connected to select line SELn'. Because transistor Qic is to be read from read line RLm as a selected voltage, two volts are applied to read line RLm while bit line BLm is held at ground. Word line WLi has a high voltage Vcc applied thereto while all other word lines such as WL(i+1) through WL(i+63) are held at ground. Bit line BLm is held at ground. All other bit lines and read lines are held at two volts and all other select lines (such as SEL(n'−1) and SEL(n+1) are at ground. Consequently, in reading the state of transistor Qic, read line RLm is at two volts while bit line BLm is at ground. Bit line BL(m+1) is also at two volts, thereby assuring -zero source-to-drain voltage across transistor Qi(c+1). Thus even though word line WLi will turn on the control transistor of asymmetric transistor Qi(c+1), transistor Qi(c+1) will not conduct a current because its source and drain are at the same voltage. However, the high voltage on word line WLi turns on the control portion of transistor Qic thereby enabling asymmetric transistor Qic to either conduct current or not conduct current depending on the state of the floating gate associated with this transistor.

Note that transistors Qic and Qi(c+1) are symmetrically oriented with respect to read line RLm. Thus, the floating gate associated with transistor Qic is separated from read line RLm by the control or select transistor associated with the asymmetric transistor Qic and equivalently, the floating gate associated with asymmetric memory transistor Qi(c+1) is also separated from read line RLm by the select or control transistor associated with memory transistor Qi(c+1). Thus each of the memory transistors in the column c and in the column (c+1) are arranged to be symmetric with respect to read line segment RLma. Likewise the memory transistors associated with column c+2 and c+3 are also arranged to be symmetric with respect to read line RL(m+1). This ensures that one read line RL is able to read out a cell selected from a column on either side of the read line RL.

Because of the symmetrical arrangement of the transistors in the cells on either side of each read line RL, the floating gate transistors can also be symmetrical in structure as well as asymmetrical. A symmetrical floating gate transistor would have the control transistor removed. Indeed the select transistors controlled by the signals on control lines SELn and SELn', for example, control the current to any one of the floating gate transistors connected to the read line controlled by the activated select transistors.

To read a memory cell containing a transistor such as transistor Qi(c+1) in column c+1, read line RLm is again brought to two volts, but instead of bit line BLm being grounded as when transistor Qic was being read, bit line BL(m+1) is grounded and bit line BLm is kept at two volts. Word line WLi is brought high to Vcc, the supply voltage. Consequently, the output state of transistor Qi(c+1) is detected by means of a signal passed through transistor Qi(c+1) in response to the voltage difference across this transistor between read line RLm and bit line BL(m+1).

Note that the signal on bit line BL(m+1) is zero volts while the signal on read line RL(m+1) is two volts. Accordingly transistor Qi(c+2) will also be read. The select lines SELn and SELn' have a high level signal VCC applied thereto thereby turning on the select transistors Qnj and Qn'j, and thus a signal will also be present on read line RL(m+1). However the output sense amplifier associated with this read line will not be activated and thus the signal on read line RL(m+1) will not be detected at the output terminal associated with read line RL(m+1).

To program a cell, for example the cell containing transistor Qic in the odd column (i.e. the column labeled 0), read line RLm is grounded and bit line BLm is raised to eight or nine volts. The select line is placed at the voltage Vpp and the word line WLi is also placed at the voltage Vpp. During programming the bit line BLm acts as the drain for transistor Qic and the read line RlM acts as the source for transistor Qic, just the opposite of how these two lines are used when transistor Qic is being read. All other word lines are grounded and all other bit lines are floating or have P-leakers. Likewise all other read lines are floating or have P-leakers. All other select lines are grounded. The application of a high voltage (8–9 volts) to bit line BLm together with the select lines SELn and SELn' connected to select transistors Qn(j−1) and Qn'(j−1) being at Vpp means that a current is drawn through the contacts RC(i−1)(j−1) and RCi(j−1) and then through transistor Qic. The control transistor associated with transistor Qic is turned on by the high voltage Vpp on word line WLi thereby to charge (i.e., place electrons on) the floating gate associated with transistor Qic. If the transistor Qi(c+1) in the even column (i.e., the column denoted "E") is being programmed, then read line RLm is still grounded but bit line BL(m+1) is raised to eight or nine volts. Select line SELn and SELn' are also raised to the voltage Vpp and the word line WLi is raised to Vpp. Since the select lines serve only to activate the sources of the transistors being programmed through, for example, select transistors Qn(j−1) and Qn'(j−1) there is an option to have Vcc rather than Vpp on the gates of select transistors Qn(j−1) and Qn'(j−1). This in turn eliminates the need for a high voltage transistor on the select line decoder, and hence makes the selection of a select line faster. This is very important since the precharge of the read line segment during read is done through the select transistor. In this situation, to program transistor Qi(c+1), the programming voltage is applied across transistor Qi(c+1) with bit line BL(m+1) acting as the drain contact and read line RLm acting as the source contact (just the opposite to the situation when transistor Qi(c+1) is being read out) thereby to program transistor Qi(c+1). Note that transistor Qi(c+2) will also have a high voltage on its drain for programming purposes. However the voltage on its source which is connected to read line RL(m+1) will be floating or be a P-channel leaker.

The main issues with the above array are read-precharge and bit line discharge when the bit line serves as a source as it does during the read operation. The other problem is the programming of adjacent cells when the bit line serves as a drain during programming of a given cell due to the floating source of the neighboring cell also connected to the bit line. To solve the program disturb problem there are several options.

1. Float the read lines that are not grounded. The cell has to charge the read line segment and then the source line associated with the cell has a high enough voltage not to disturb the state of the cell. The read line segment charges rapidly because of its small capacitance.

2. Delay the charging of the select line relative to the charging of the word line during programming. This will further reduce the capacitance on the segment during the charging time since it will disconnect the metal line from the underlying read line segment for so long as the select line voltage remains low.

3. Apply Vcc to the read lines of the transistor not being programmed during programming. The disadvantage of this is the extra complexity in the circuitry used for programming.

If desired, the control transistors (sometimes called the "select transistor") associated with each of floating gate transistors Qic, Qi(c+1) through Q(i+63)(c+4) (See FIG. 1) can be removed. In this situation, select transistors such as Qn(j−1) and Qn'(j−1) will operate as the control transistor and will control the current flowing to the particular floating gate transistor in the cell being operated upon and connected to read line -segment RLma. Likewise select transistors Qnj and Qn'j will control the current flowing to the particular cell being operated on and connected to read line segment RL(m+1)a. Select transistors Qn(j+1) and Qn'(j+1) will control the current flowing to the floating gate transistors in the cells connected to read line segment RL(m+2)a. The function of select transistors Qn(j−1) . . . Qn'(j+1) and the other comparable select transistors in the array is described, for example, in copending patent application, Ser. No. 07/539,657 filed Jun. 13, 1990 and previously incorporated by reference in its entirety.

Figure 2:
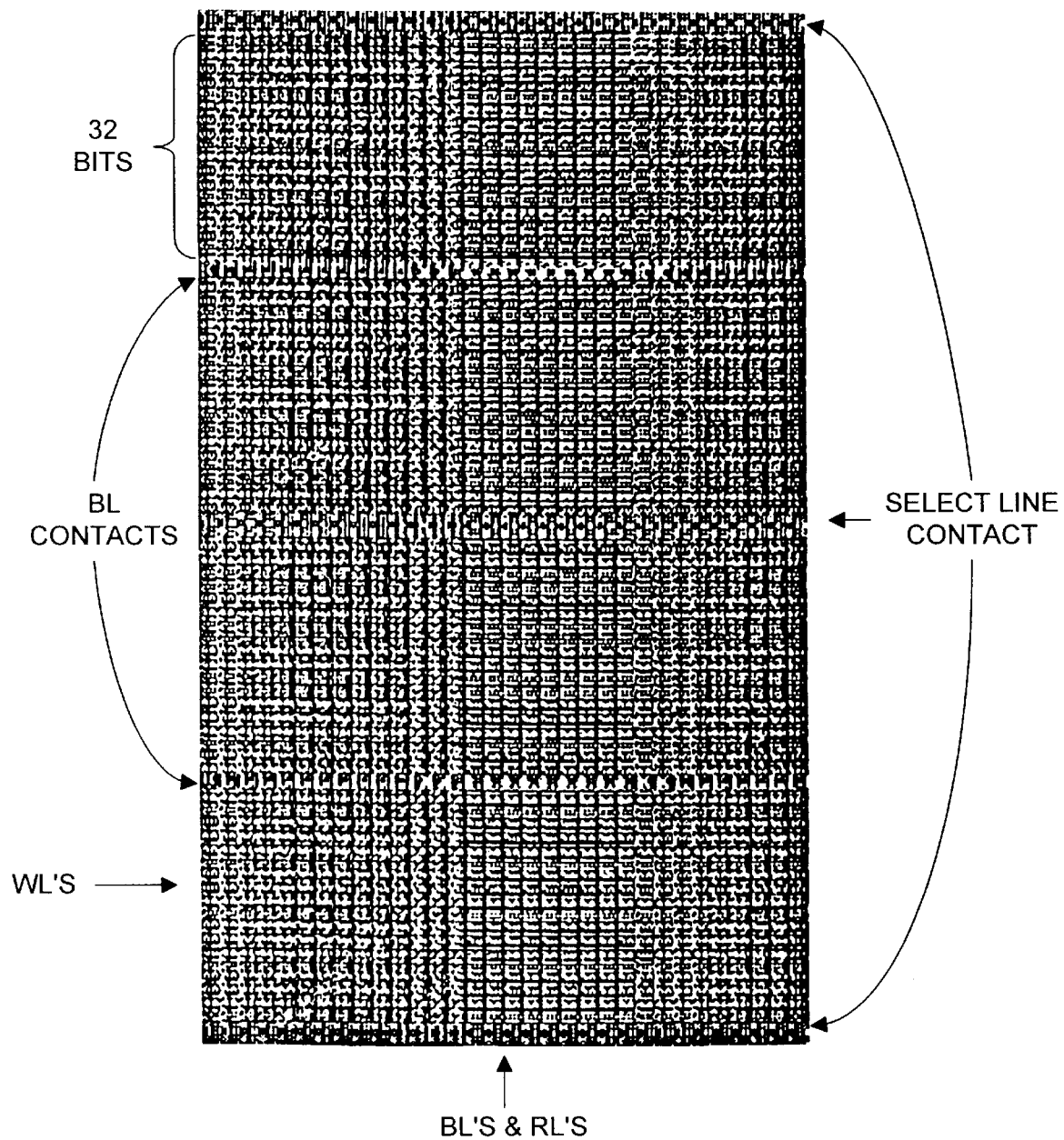
FIG. 2 shows the top view of a portion of an array implemented in accordance with this invention.

The array cell layout is shown in FIG. 2. Select line contacts as well as the bit line contacts are shown there to illustrate the contact staggering and the 64 bit read line segments. As a result of the contact staggering, a contact hole is provided in the array every 32 bits. The array layout has three features: (1) the cell, (2) the read line RL select area and (3) the bit line BL contact area. The detailed layout and dimensions of a memory cell in one embodiment of the invention are discussed below.

Figure 3A:
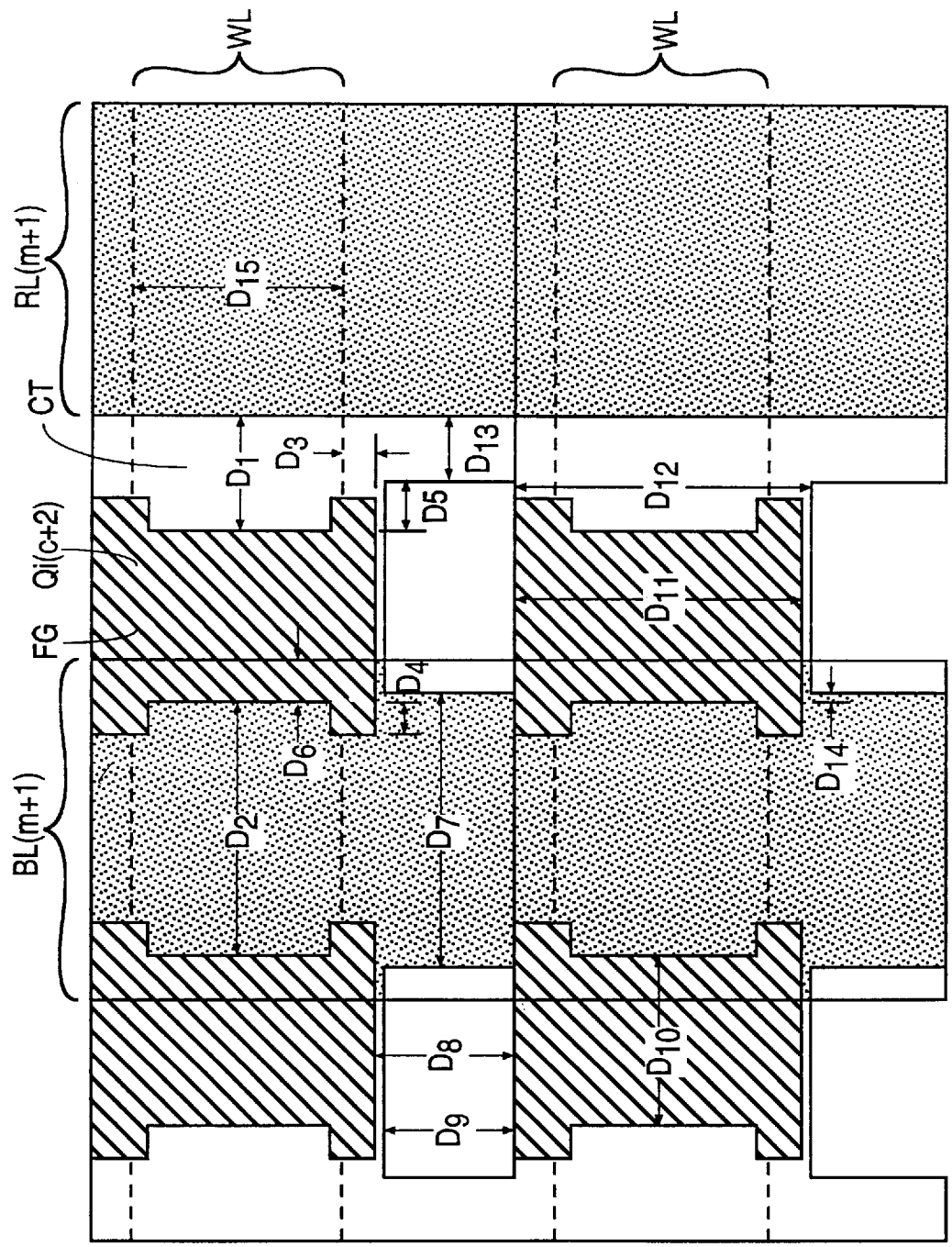
FIG. 3A illustrates a typical cell size of a memory transistor associated with this invention.
Figure 3B:
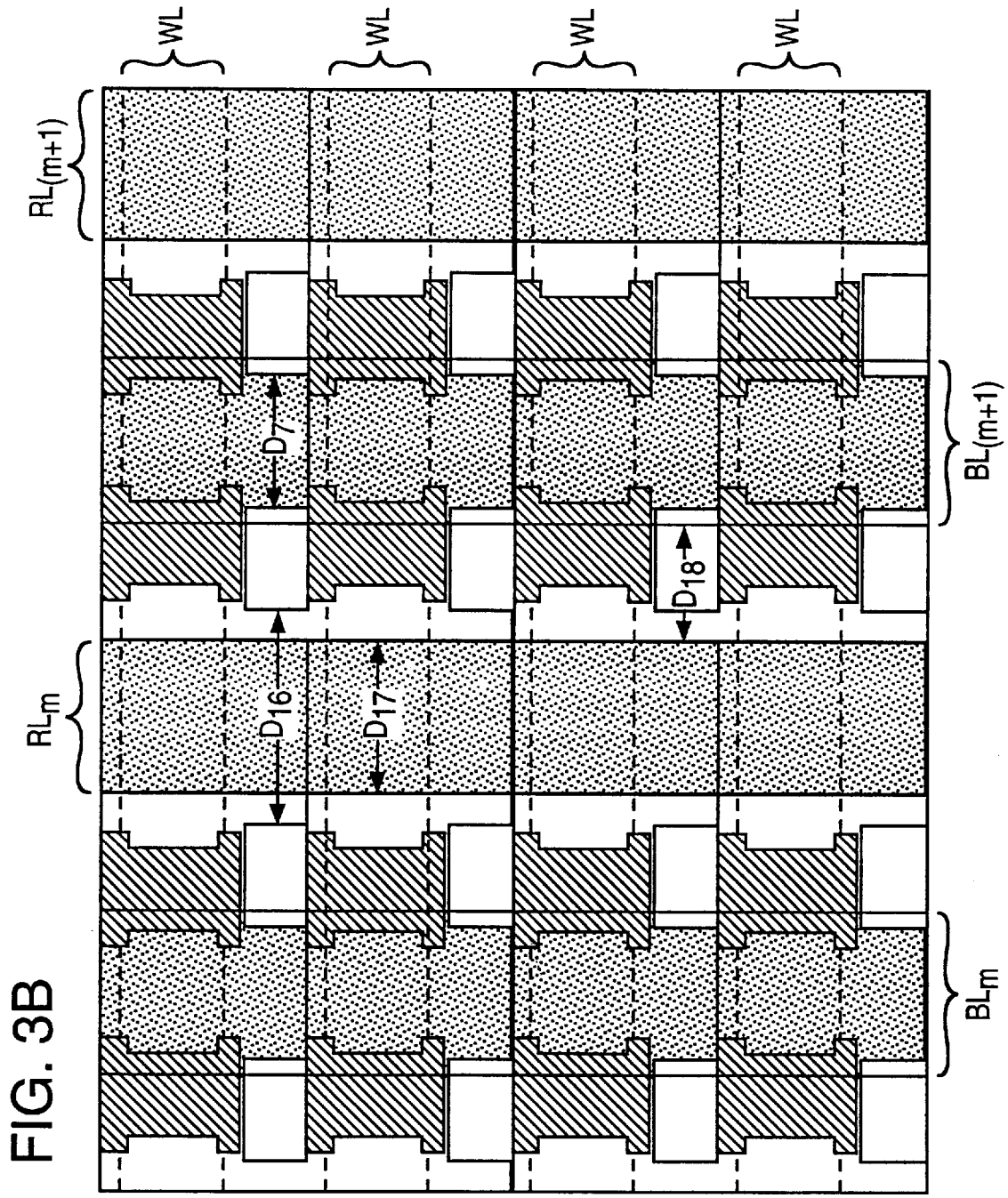
FIG. 3B illustrates the relationship of a plurality of cells associated with this invention to the read line and the bit line.

FIGS. 3A and 3B show the detailed cell layout. In FIG. 3A a given cell, such as the cell containing transistor Qi(c+2), is formed between read line RL(m+1) and bit line BL(m+1). Shown in FIG. 3A is the floating gate FG of transistor Qi(c+2). The source (drain) of transistor Qi(c+2) consists of diffused read line RL(m+1) while the drain (source) of transistor Qi(c+2) consists of diffused bit line BL(m+1). Bit line BL(m+1) serves as the drain during programming and the source during reading while read line RL(m+1) serves as the source during programming and the drain during reading. The portion of structure between read line RL(m+1) and gate Qi(c+2) identified by the notation CT is the portion of asymmetrical transistor Qi(c+2) consisting of the select or control transistor. The semiconductor substrate beneath this portion of the memory cell has been implanted with appropriate impurities to form a portion of the channel region. In this embodiment, the length $D_1$, of this portion of the channel is 0.7 microns as shown. In FIG. 3A, distance $D_2$ is 1.6 $\mu$m, $D_3$ is 0.2 $\mu$m, $D_4$ is 0.1 $\mu$m, $D_5$ is 0.3 $\mu$m, $D_6$ is 0.3 $\mu$m, $D_7$ is 1.8 $\mu$m, $D_8$ is 1.1 $\mu$m, $D_9$ is 1.0 $\mu$, $D_{10}$ is 1.3 $\mu$m, $D_{11}$ is 1.9 $\mu$, $D_{12}$ is 2.0 $\mu$m, $D_{13}$ is 0.4 $\mu$m, $D_{14}$ is 0.1 $\mu$m, and $D_{15}$ is 1.5 $\mu$m.

FIG. 3B illustrates the structure of FIG. 3A with 1.2 micron design rules. The comments above with respect to FIG. 3A apply equally to FIG. 3B. In FIG. 3B, distance $D_{16}$ is 2.4 $\mu$, $D_{17}$ is 1.6 $\mu$m, and $D_{18}$ is 1.8 $\mu$m.

Figure 4:
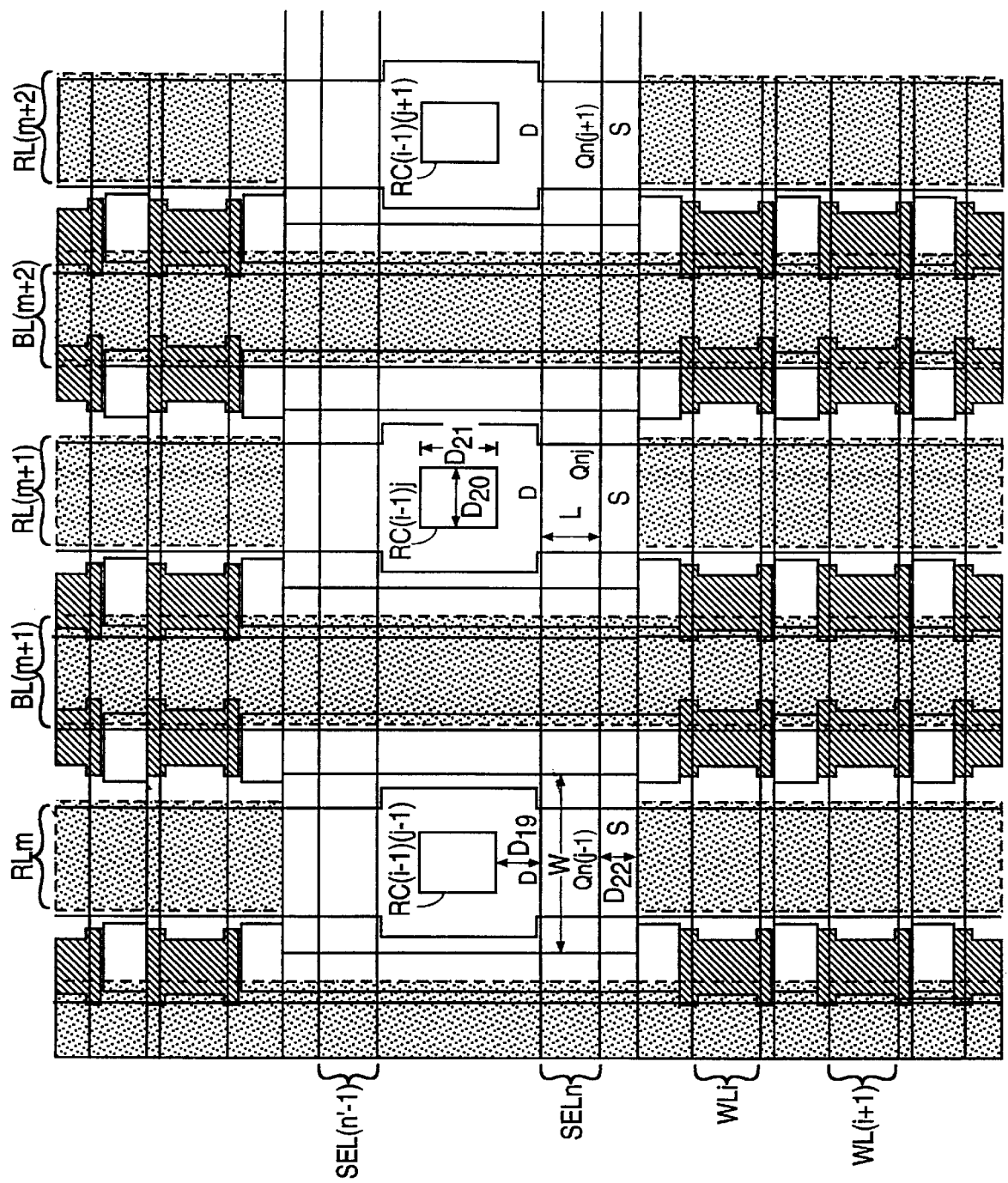
FIG. 4 illustrates the metal lines overlying the diffused read lines and the contacts to the read lines from the metal lines overlying the diffused read lines.

The read line contact areas RC(i-1)(j-1), RC(i-1) and RC(i-1)(j+1) and the corresponding select transistors Qn(j-1), Qnj and Qn(j+1) associated therewith, and shown in FIG. 1 are illustrated in FIG. 4. Note that the read line contacts are staggered relative to the bit line contacts as shown in FIGS. 1 and 2. Thus FIG. 4 shows only the read line contacts RC(i-1)(j-1), RC(i-1)(j) and RC(i-1)(j+1). In addition the select transistors Qn(j-1), Qnj and Qn(j+1) associated with these contacts are shown with the select line SELn running over the channel regions of these select transistors.

In one embodiment the pass or select transistors having channel width W of 3.8 $\mu$m and channel length L of 1.6 $\mu$m such as Qnj are each micron standard NMOS transistors. The selection of the particular read line segment such as segment RLma to be accessed uses two such select transistors, one connected to the top and the other connected to the bottom of the segment as shown, for example, in FIG. 1. Thus the read line segment RLma is selected by use of select or pass transistors Qn(j-1) and Qn'(j-1) as shown in FIG. 1. The choice of a standard low voltage, minimum-channel-length transistor for each of the pass transistors such as transistor Qnj by a select line such as line SELn and line SELn' is based on applying high voltage only to the bit lines such as BLm, BL(m+1) and BL(m+2) during programming and not to the read lines.

The key issue in the select transistor is the bit line-n+ layout. In one embodiment there is zero bit line-n+ overlap. In the worst case the actual overlap is about 0.45 microns. As shown in FIG. 4, select lines SEL(n'-1) and SELn run horizontally across the figure. Word lines WLi and WL(i+1) also run horizontally across the array. Read lines RLm, RL(m+1) and RL(m+2) run vertically across the array as do bit lines BL(m+1) and BL(m+2). The bit lines and read lines are formed with one implant known as the bit line implant. The periphery of the integrated circuit containing the logic circuitry for operating the array (i.e., writing information into and reading information from the cells in the array) is protected by photoresist in this implant.

In addition, the regions in the array in which the contacts are to be formed to the bit lines and the read lines are masked with photoresist so that these regions also are protected from being implanted during this step.

The bit line and read line diffusions are defined by vertical strips of polycrystalline silicon. Subsequently the polycrystalline silicon is masked and etched to form the floating gates of the to-be-formed memory transistors such as transistor Qic in the memory array.

A layer of insulation is placed on the chip and then a second layer of polycrystalline silicon is formed on the chip and patterned into the horizontal conductive strips known as the select and word lines denoted by the notation SELn and WLi, respectively, for example. An additional implant is then made over the surface of the chip and particularly those portions of the chip in which the select transistors are to be formed (which were previously masked along with the periphery during the bit line implant) to form the source and drain regions of the select transistors such as transistor Qn(j-1), Qnj and Qn(j+1). The sources of these transistors are labeled with an S and the drains of these transistors are labeled with a D in FIG. 4, although these designations are somewhat arbitrary and could be reversed since the select transistors such as transistor Qnj function as pass transistors. The overlap of the implantation to form the sources of the select transistors with the previously formed read line implants ensures a solid conductive contact between these two regions. Such a contact is required to ensure that each read line segment such as segment RLma (see FIG. 1) is properly connected to the read line contacts such as contacts RC(i-1)(j-1) and RCi(j-1). In FIG. 4, distance $D_{19}$ is 1.0 $\mu$m, $D_{20}$ is 1.2 $\mu$m, $D_{21}$ is 1.8 $\mu$m, and $D_{22}$ is 1.0 $\mu$m.

The floating gate islands (i.e., the floating gates of the to-be-formed memory transistor such as transistor Qic in FIG. 1) have been described as being formed prior to the deposition and patterning of the second layer of polycrystalline silicon. In an alternative embodiment, the second layer of polycrystalline silicon is formed on the chip and patterned into the horizontal conductive strips to become the select and word lines before the first layer polycrystalline silicon strips are further etched to form the floating gates of the to-be-formed memory transistors such as transistor Qic. The horizontal conductive strips formed from the second layer of polycrystalline silicon are then used as the mask for the etching of the polycrystalline silicon strips formed from the first layer of polycrystalline silicon thereby to form the floating gate islands of each of the memory transistors self-aligned to the poly-2 word lines.

Figure 3C:
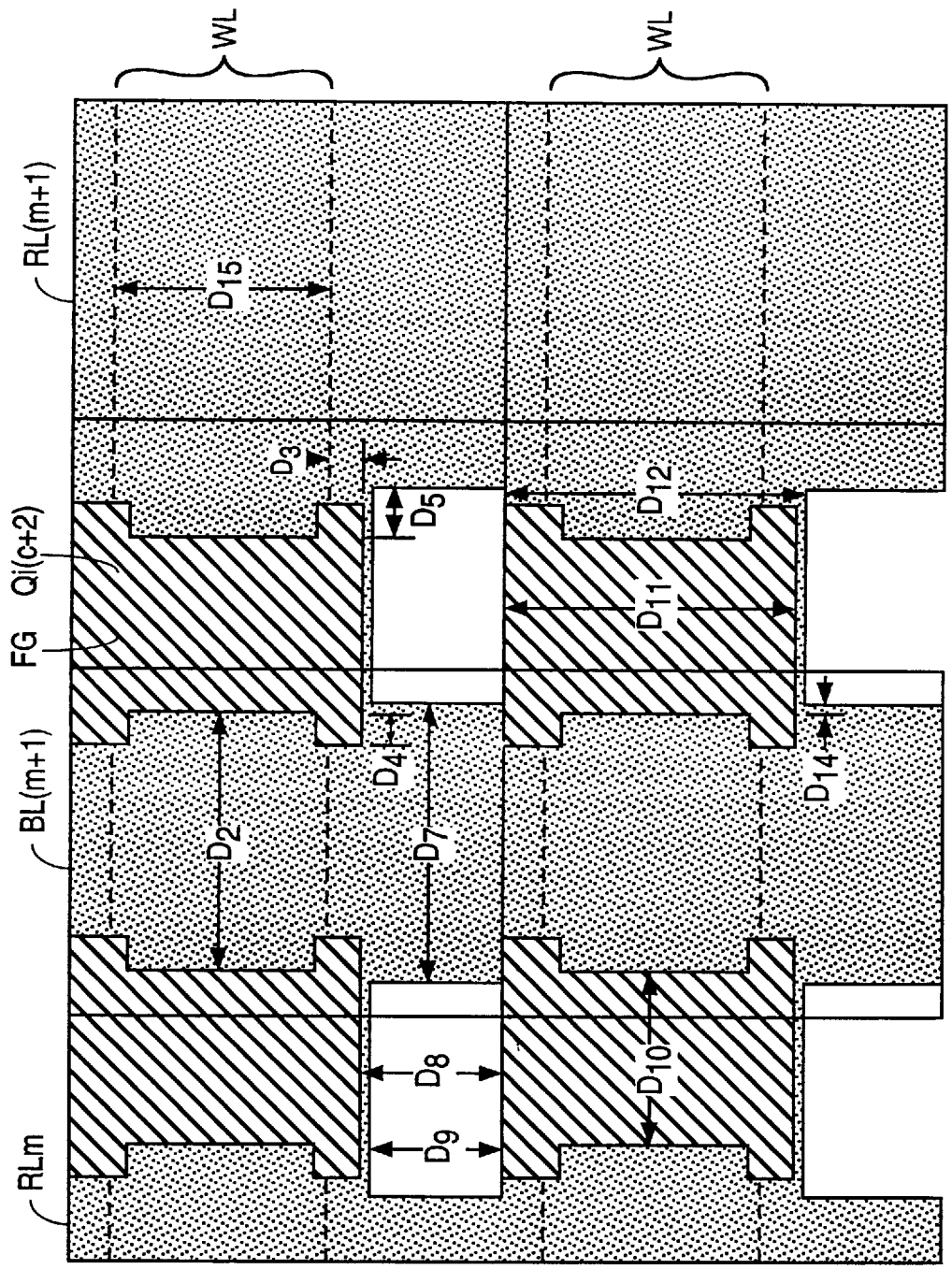
FIG. 3C illustrates a typical cell size of a memory transistor without the control gate associated with each memory transistor as shown in FIGS. 3A and 3B.

In a further alternative embodiment, the field oxide is formed in the normal manner over the surface of the device. Then a polycrystalline silicon layer is formed over the device and patterned and etched to form each of the floating gate islands. The process then branches into one of two alternative sequences of process steps. First, if asymmetric memory transistors are to be fabricated in the memory array, a bit line mask is used to cover not only the floating gate islands but a portion of the substrate on one side of each floating gate island to define the channel portion of the to-be-formed control transistor associated with each memory transistor such as transistor Qic (FIG. 1). Then an implant is made over the surface of the device to form the bit lines and the read lines. Alternatively, a second process sequence is used when a symmetric floating gate transistor structure is to be fabricated in the memory array wherein each memory transistor does not have immediately contiguous thereto a control transistor. In this embodiment, the floating gate islands and the field oxide are used to define the bit lines and the read lines. This is the structure shown in FIG. 3C. In FIG. 3C, distance $D_2$ is 1.6 $\mu$m, $D_3$ is 0.2 $\mu$m, $D_4$ is 0.1 $\mu$m, $D_5$ is 0.3 $\mu$m, $D_7$ is 1.8 $\mu$m, $D_8$ is 1.1 $\mu$m, $D_9$ is 1.0 $\mu$m, $D_{10}$ is 1.3 $\mu$m, $D_{11}$ is 1.9 $\mu$m, $D_{12}$ is 2.0 $\mu$m, $D_{14}$ is 0.1 $\mu$m, and $D_{15}$ is 1.5 $\mu$m.

The bit line in the structure of this invention (see, for example, bit line BLm in FIG. 1) is continuous. This is required because the bit line must carry the high volt age (typically eight or nine volts) and current (typically one milliamp) required to program each of the memory transistors connected to the bit line. The select transistors within the array (such as transistors Qn(j-1), Qnj, Qn(j+1), Qn'(j-1), Qn'j and Qn'(j+1)) are much too small to pass such a current while at the same time sustaining the high programming voltage. Naturally, the select transistors must pass the current used to program each of the memory transistors because the appropriate read line (such as read line RLm) is serving as the grounded source line. However, the select transistors within the array (such as transistors Qn(j-1) to Qn'(j+1) cannot sustain simultaneously both the programming current and the programming voltage. Accordingly, the bit line select transistors are formed in the periphery of the memory array and have a much larger width than the select transistors used with the segmented read lines thereby allowing the passage of the programming current (one milliamp) at the programming voltage (eight or nine volts).

To allow the bit lines select transistors to be placed in the periphery of the device, as required, the bit lines cannot be segmented.

Figure 5:
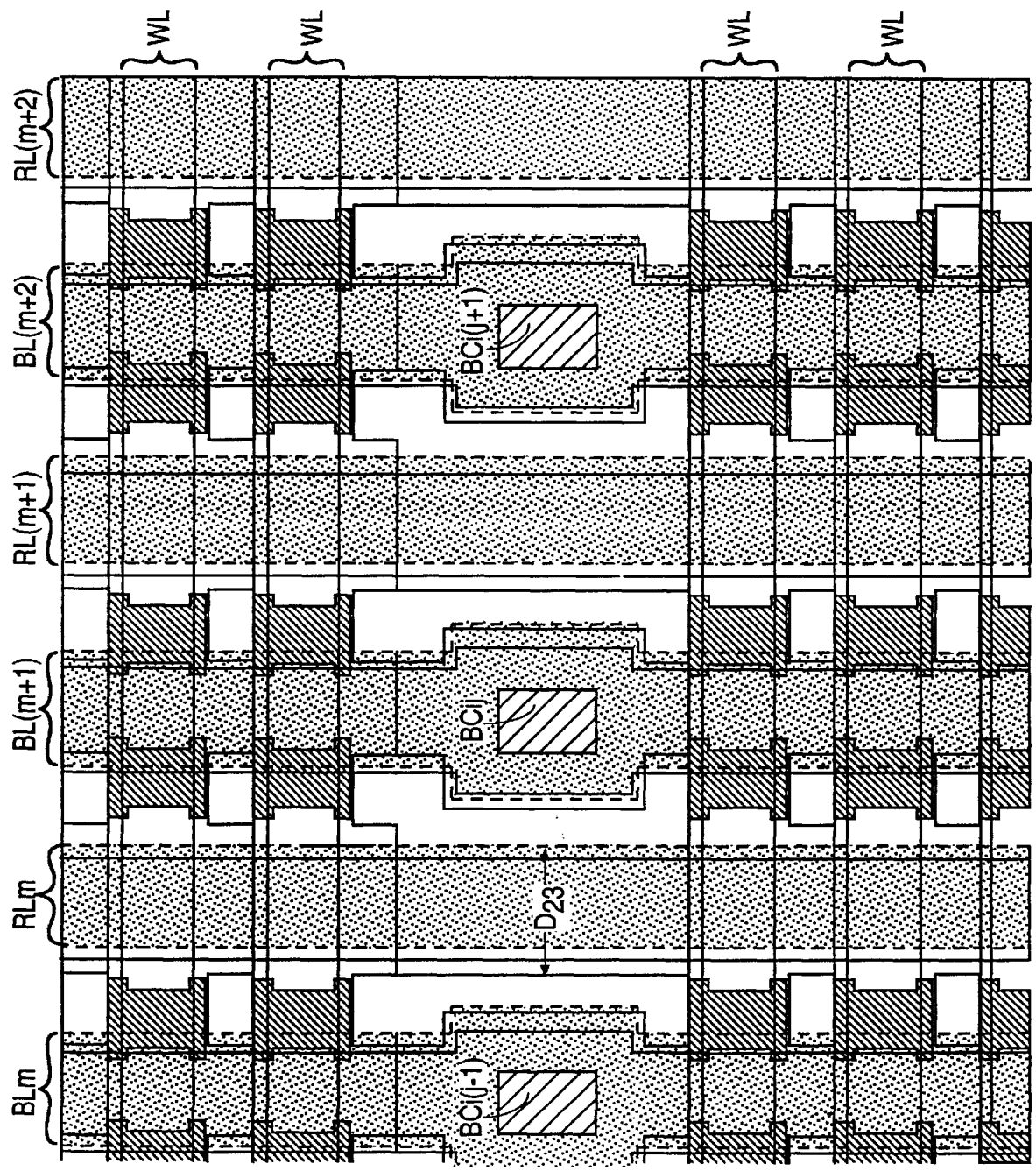
FIG. 5 illustrates the relationship of the metal lines overlying the diffused bit lines and the contacts to the bit lines from the metal lines overlying the diffused bit lines.

FIG. 5 illustrates the bit line contact area and the adjacent read line feed through. The bit line contacts BCi(j−1),BCij and BCi(j+1) to the overlying metal lines are shown in FIG. 5. In FIG. 5, distance $D_{23}$ is 1.8 μm.

FIGS. 6A through 6E are graphs illustrating the performance characteristics and particularly the capacitance of the memory array of this invention as a function of certain parameters. The terms used in these graphs are defined as follows:

CRL=read line segment capacitance
CBL=bit line capacitance
CWL=word line capacitance
TBL=thickness of the bit line oxide
VRL=voltage on the read line
OB=length of bird beak between the field oxide and the transistor channel regions obtained using recessed oxide isolation.

Figure 6A:
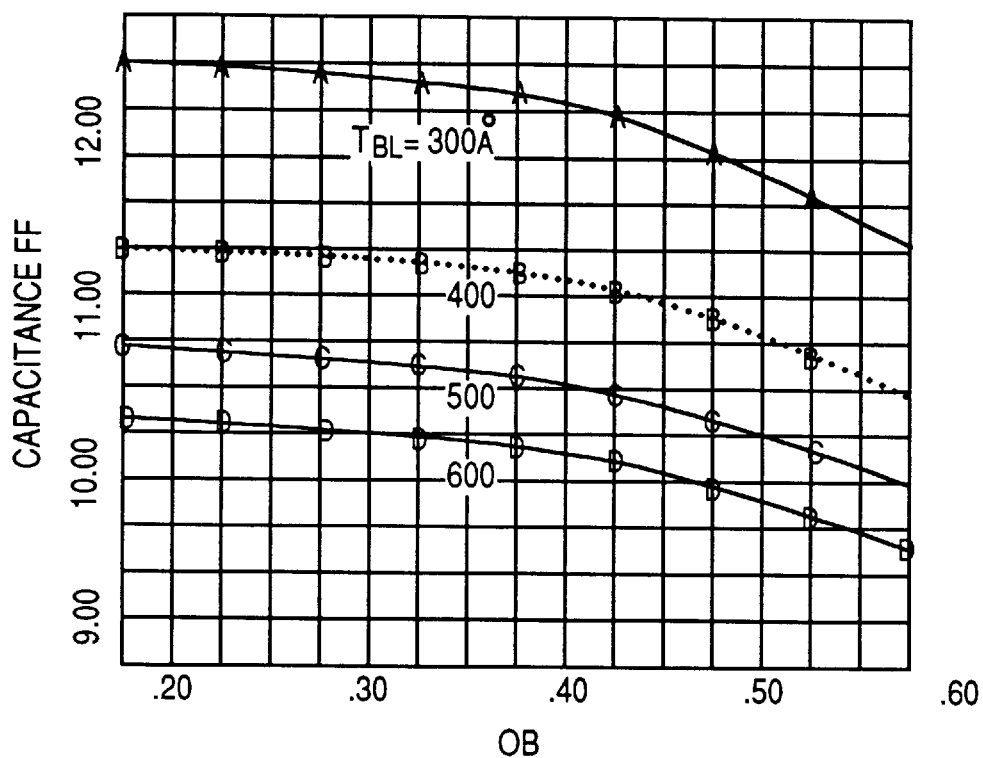
FIGS. 6A, 6B, 6C, 6D and 6E are graphs, respectively, of the capacitance of the read line versus the thickness OB of the oxide beak with the thickness of the bit line as a parameter; the capacitance of the bit line versus OB with the thickness of the bit line as a parameter; the capacitance of the read line versus the voltage on the read line with OB as a parameter; the capacitance of the word line versus of the thickness of the bit line with OB as a parameter, and the capacitance of the word line versus OB with the thickness of the bit line as a parameter.

FIG. 6A illustrates the capacitance in femptofarads ($10^{-15}$ farads) of the read line versus the bird beak length in microns. As the bird beak length goes up, the capacitance of the read line goes down. Likewise as the thickness of the bit line oxide goes up the capacitance of the read line goes down.

Figure 6B:
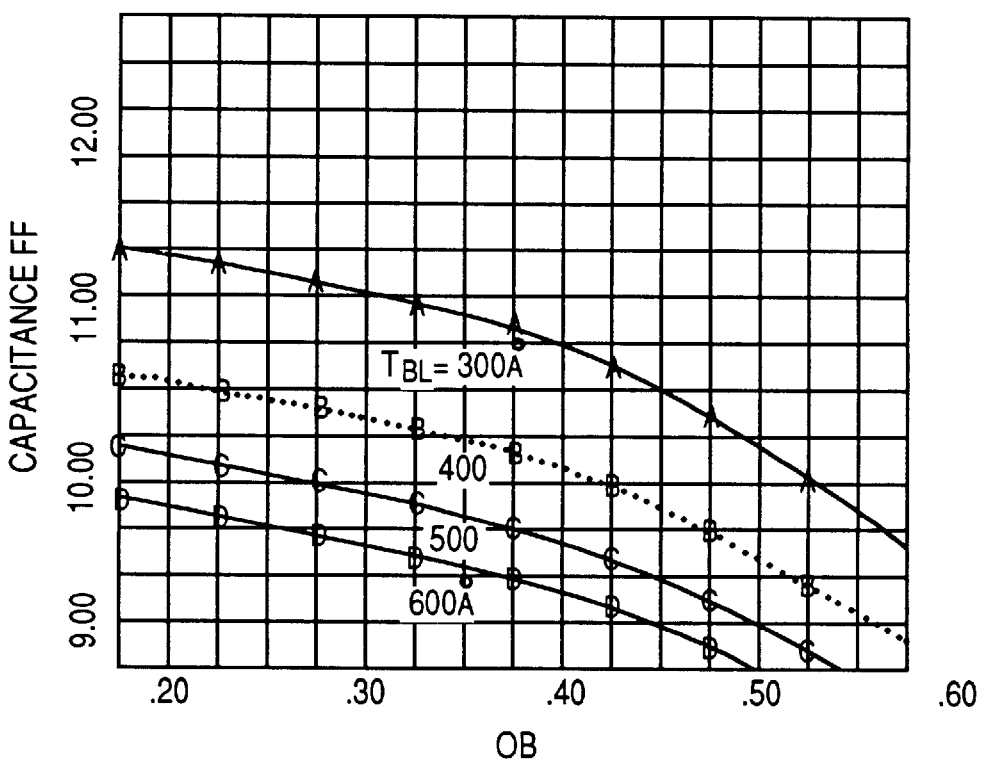

FIG. 6B shows the capacitance of the bit line versus the bird beak length. As the bird beak length goes up the capacitance of the bit line goes down. Also as TBL increases in thickness the capacitance of the bit line goes down.

Figure 6C:
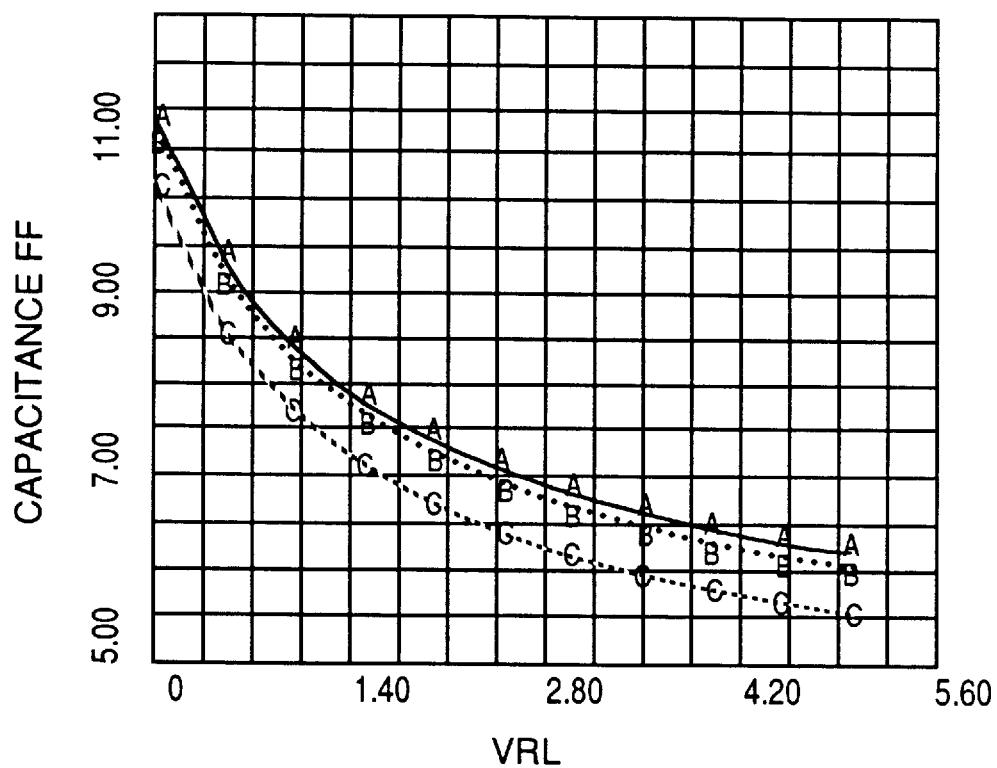

FIG. 6C shows the capacitance of the read line versus the voltage on the read line as a function of the bird beak dimensions. As the voltage on the read line goes up the capacitance of the read line drops reflecting the formation of depletion regions between the diffused read line and the surrounding substrate due to the read line voltage increase.

Figure 6D:
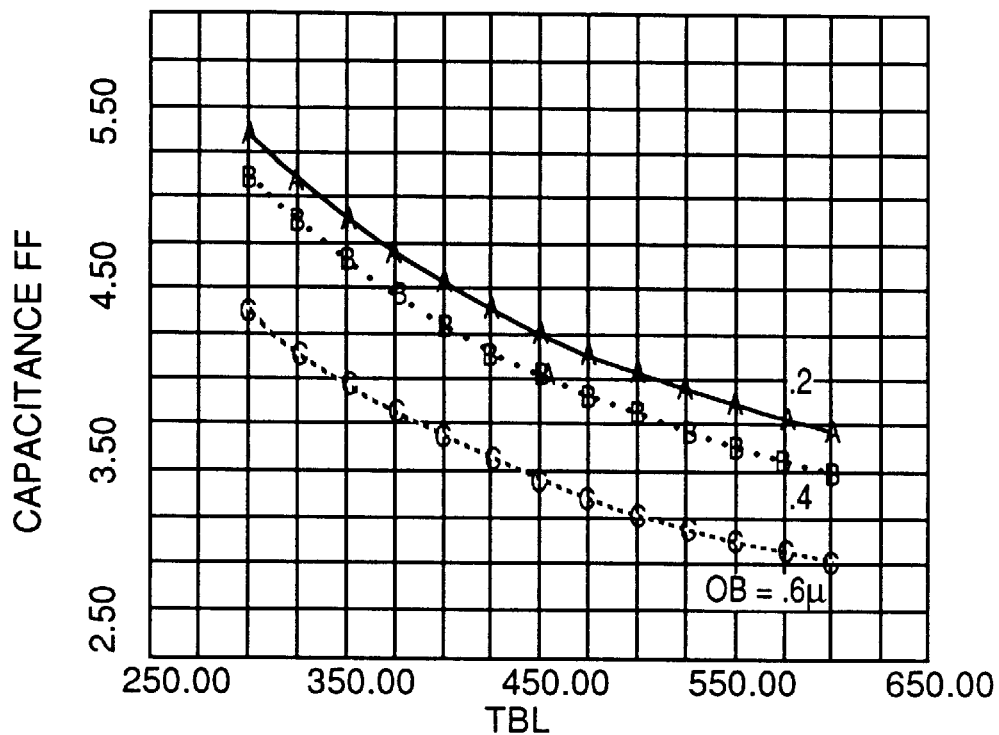

FIG. 6D shows the capacitance of the word line as a function of the bit line oxide thickness (which is the thickness of the oxide over the diffused bit line and under the poly-2 layer) with the bird beak as a parameter. As the bird beak becomes larger, the capacitance associated with the word line decreases reflecting the smaller diffusion area beneath the word line. Also the capacitance of the word line drops as the bit line oxide thickness increases.

Figure 6E:
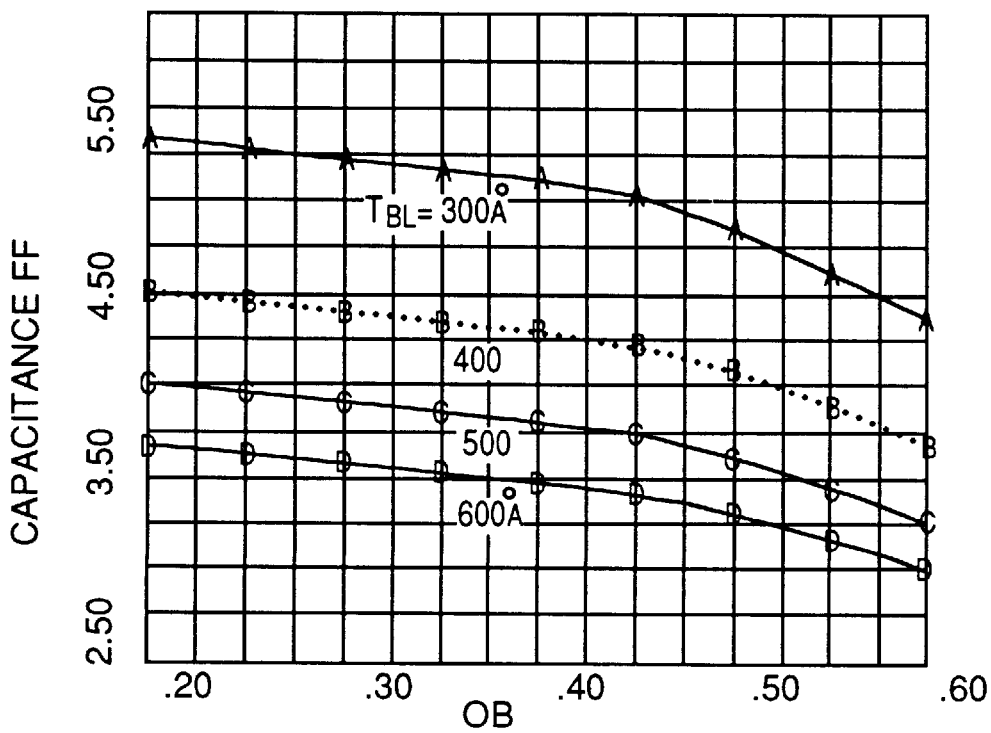

FIG. 6E plots the capacitance of the word line versus the bird beak length with the bit line oxide thickness as a parameter. The capacitance of the word line drops as the bird beak length increases and the capacitance also drops as the bit line oxide thickness increases.

As a result of this invention an EPROM array is provided with both high density and high speed. The segmentation of the read lines significantly reduces the capacitance associated with each memory cell transistor and thus significantly increases the speed of writing information to and reading information from each memory cell in the array. Moreover, the removal of the select or control transistor contained in the prior art asymmetric memory cell from each memory cell and the combining of the select transistors from a plurality of cells into one select transistor and the use of two select transistors at the ends of each read line segment result in a significant increase in density over the densities achieved in prior art EPROM arrays.

What is claimed is:

1. An EPROM array comprising:
   a semiconductor substrate;
   a plurality of floating gate transistors formed in and on said substrate, said floating gate transistors being arranged in rows and columns;
   a multiplicity of bit lines, BL0, . . . BLm, BL(m+1) . . . BLM wherein M+1 is an integer equal to the number of said bit lines, m is an integer given by $0 \leq m \leq M$, and BLm represents any one of said bit lines; and
   a plurality of read lines, RL0, . . . RLm, RL(m+1), . . . RL(M−1), wherein:
      said read lines are interleaved with said bit lines such that each read line RLm is placed between bit line BLm and bit line BL(m+1);
      each of said read lines is formed in said semiconductor substrate and is divided into a plurality of electrically-isolatable segments, each segment having two ends; and
      each of said bit lines is formed in said semiconductor substrate and is continuous.

2. Structure as in claim 1 wherein said EPROM array includes:
   a first column of memory transistors formed between and coupled to bit line BLm and read line RLm; and
   a second column of memory transistors formed between and coupled to read line RLm and bit line BL(m+1), such that during programming of a given memory transistor in one of said two columns of memory transistors, the bit line connected to said memory transistor acts as the drain and the read line connected to said memory transistor acts as the source and during the readout of information stored in a given cell the read line RLm connected to said memory transistor acts as the drain and the bit line connected to said memory transistor acts as the source.

3. Structure as in claim 2 including a metal line formed over but insulated from each of said read lines;
   a plurality of electrical contacts running from each overlying metal line to the underlying read line between adjacent segments of said read line; and
   a pass transistor formed at each end of each segment of said read line thereby to allow said segment to be connected to the contacts between segments and thereby to be connected to the metal line formed above but insulated from said read line.

4. Structure as in claim 1 wherein the memory transistor in said first column and the memory transistor in said second column are arranged symmetrically with respect to read line RLm.

5. Structure as in claim 4 wherein each memory transistor in said array comprises an asymmetric structure including both a floating gate transistor and a control transistor.

6. Structure as in claim 4 wherein each memory transistor in said array comprises a floating gate transistor.

7. An EPROM array comprising:
   a plurality of floating gate transistors arranged in rows and columns;
   a multiplicity of bit lines alternating with a plurality of read lines such that each read line is between two bit lines;
   a column of memory transistors placed between each adjacent bit line and read line;
   wherein each read line is broken into a plurality of electrically-isolatable segments and each bit line is continuous and formed by diffusion in a substrate.

8. Structure as in claim 7 including at least one select transistor to connect each read line segment to a corresponding electrical conductor.

9. Structure as in claim 7 wherein two select transistors are provided for connecting each read line segment to a corresponding electrical conductor.

10. Structure as in claim 8 wherein each electrical conductor comprises a metal line formed over but insulated from said underlying read line; and wherein electrical contacts extend from said metal line through said insulation to one terminal of said at least one select transistor to allow said metal conductor to be connected to said read line segment.

11. Structure as in claim 9, wherein each electrical conductor comprises a metal line formed over but insulated from said underlying read line; and wherein electrical contacts extend from said metal line through said insulation to one terminal of each of said two select transistors to allow said metal conductor to be connected to said read line segment.

12. Structure as in claim 7, wherein a multiplicity of select transistors located in the periphery of the memory array are connected on a one-to-one basis to said multiplicity of bit lines, each select transistor being of a size sufficient to allow a programming voltage and current to be applied to the bit line thereby to allow a selected memory transistor connected to said bit line to be programmed.

13. An EPROM array comprising:
    a plurality of alternating non-segmented bit lines and segmented read lines wherein each read line is broken into a plurality of electrically isolatable segments formed by diffusion in a semiconductor substrate.

14. An EPROM array as in claim 13 including:
    a selected number of memory cells connected between each bit line and read line.

15. A common connection for an integrated-circuit memory, said memory having a control circuit, at least one memory cell array having column lines, and a programming circuit including at least first and second parts, comprising:
    at least one column of said at least one memory array selectively connected to a common conductor upon receiving at least a first signal from said control circuit;
    said first part of said programming circuit selectively connected to said common conductor upon receiving at least a second signal from said control circuit; and
    said second part of said programming circuit connected to said common conductor upon receiving at least a third signal from said control circuit.

16. The common connection of claim 15, wherein said common conductor extends from a first area of said integrated-circuit memory to a second area of said integrated-circuit memory.

17. The common connection of claim 15, wherein said common conductor is a circuit node.

18. The common connection of claim 15, including a sense amplifier circuit, wherein said sense amplifier circuit is selectively connected to said common conductor upon receiving at least a fourth signal from said control circuit.

19. The common connection of claim 15, wherein said first and second parts of said programming circuit are located at opposite ends of said integrated circuit memory.

20. The common connection of claim 15, wherein said first part of said programming circuit provides a high voltage to a source-column line of said integrated-circuit memory.

21. The common connection of claim 15, wherein said second part of said programming circuit provides a reference potential and a supply voltage to said common conductor.

22. The common connection of claim 15, wherein said integrated-circuit memory is an electrically-programmable read-only memory.

23. The common connection of claim 15, including a plurality of memory cell arrays, wherein said one column of one of said memory cell arrays is selectively connected to said common conductor upon receiving at least a fourth signal from said control circuit.

24. A common connection for an integrated-circuit memory, said memory having a control circuit, a plurality of memory cell arrays having column lines, a sense amplifier circuit, and a programming circuit including at least first and second parts, comprising:
    at least one column of said at least one memory array selectively connected to a common conductor upon receiving at least a first signal from said control circuit;
    said first part of said programming circuit selectively connected to said common conductor upon receiving at least a second signal from said control circuit; and
    said second part of said programming circuit connected to said common conductor upon receiving at least a third signal from said control circuit;
    wherein said common conductor extends from a first area of said integrated-circuit memory to a second area of said integrated-circuit memory;
    wherein said sense amplifier circuit is selectively connected to said common conductor upon receiving at least a fourth signal from said control circuit;
    wherein said first and second parts of said programming circuit are located at opposite ends of said integrated-circuit memory;
    wherein said first part of said programming circuit provides a high voltage to a source-column line of said integrated-circuit memory;
    wherein said second part of said programming circuit provides a reference potential and a supply voltage to said common conductor;
    wherein said integrated-circuit memory is an electrically programmable read-only memory; and
    wherein said one column of one of said memory cell arrays is selectively connected to said common conductor upon receiving at least a fifth signal from said control circuit.

25. An integrated-circuit memory, said memory having a control circuit, at least one memory cell array having column lines, and a programming circuit including at least first and second parts, comprising:
    at least one column of said at least one memory array selectively connected to a common conductor upon receiving at least a first signal from said control circuit;
    said first part of said programming circuit selectively connected to said common conductor upon receiving at least a second signal from said control circuit; and
    said second part of said programming circuit connected to said common conductor upon receiving at least a third signal from said control circuit.

26. The memory of claim 25, wherein said common conductor extends from a first area of said memory to a second area of said memory.

27. The memory of claim 25, wherein said common conductor is a circuit node.

28. The memory of claim 25, including a sense amplifier circuit, wherein said sense amplifier circuit is selectively connected to said common conductor upon receiving at least a fourth signal from said control circuit.

29. The memory of claim 25, wherein said first and second parts of said programming circuit are located at opposite ends of said memory.

30. The memory of claim 25, wherein said first part of said programming circuit provides a high voltage to a source-column line of said memory.

31. The memory of claim 25, wherein said second part of said programming circuit provides a reference potential and a supply voltage to said common conductor.

32. The memory of claim 25, wherein said memory is an electrically-programmable read-only memory.

33. The memory of claim 25, including a plurality of memory cell arrays, wherein said one column of one of said memory cell arrays is selectively connected to said common conductor upon receiving at least a fourth signal from said control circuit.

* * * * *